(12) United States Patent  
Ino et al.

(10) Patent No.: US 11,355,511 B2  
(45) Date of Patent: Jun. 7, 2022

(54) SEMICONDUCTOR MEMORY DEVICE

(71) Applicant: Kioxia Corporation, Minato-ku (JP)

(72) Inventors: Tsunehiro Ino, Fujisawa (JP); Akira Takashima, Fuchu (JP); Reika Tanaka, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 61 days.

(21) Appl. No.: 17/000,545

(22) Filed: Aug. 24, 2020

(65) Prior Publication Data

US 2021/0296326 A1 Sep. 23, 2021

(30) Foreign Application Priority Data

Mar. 19, 2020 (JP) .............................. JP2020-049900

(51) Int. Cl.  
*H01L 27/11578* (2017.01)  
*H01L 29/66* (2006.01)  
*H01L 27/1157* (2017.01)  
*H01L 27/11565* (2017.01)

(52) U.S. Cl.  
CPC .... *H01L 27/1157* (2013.01); *H01L 27/11565* (2013.01); *H01L 27/11578* (2013.01)

(58) Field of Classification Search  
CPC ........... H01L 27/1157; H01L 27/11578; H01L 27/11565; H01L 27/11597; H01L 27/11568; H01L 27/1159; H01L 29/516; H01L 29/6684; H01L 27/11582  
See application file for complete search history.

(56) References Cited

U.S. PATENT DOCUMENTS

| | | | |
|---|---|---|---|
| 7,355,238 B2 | 4/2008 | Takata et al. | |
| 8,569,823 B2 | 10/2013 | Ino et al. | |
| 10,096,619 B2 | 10/2018 | Ino et al. | |

(Continued)

FOREIGN PATENT DOCUMENTS

| | | |
|---|---|---|
| JP | 2005-044835 A | 2/2005 |
| JP | 2005-093753 A | 4/2005 |

(Continued)

OTHER PUBLICATIONS

Wu et al., "Ultrathin HfON Trapping Layer for Charge-Trap Memory Made by Atomic Layer Deposition", IEEE Electron Device Letters, vol. 31, No. 9, 2010, pp. 993-995.

(Continued)

*Primary Examiner* — Shahed Ahmed  
*Assistant Examiner* — Khatib A Rahman  
(74) *Attorney, Agent, or Firm* — Oblon, McClelland, Maier & Neustadt, L.L.P.

(57) ABSTRACT

A semiconductor memory device of an embodiment includes: a semiconductor layer; a gate electrode layer; a first insulating layer provided between the semiconductor layer and the gate electrode layer; a second insulating layer provided between the first insulating layer and the gate electrode layer; and an intermediate layer provided between the first insulating layer and the second insulating layer, the intermediate layer containing a first crystal of a space group Pbca (space group number 61), a space group $P4_2/nmc$ (space group number 137), or a space group R-3m (space group number 166), and the intermediate layer containing hafnium (Hf), oxygen (O), and nitrogen (N).

28 Claims, 10 Drawing Sheets

(56) References Cited

U.S. PATENT DOCUMENTS

| | | | |
|---|---|---|---|
| 2006/0081901 A1* | 4/2006 | Arimoto | G11C 11/22 257/295 |
| 2007/0045689 A1* | 3/2007 | Lim | H01L 28/65 257/295 |
| 2008/0087890 A1* | 4/2008 | Ahn | H01L 21/31604 257/43 |
| 2009/0134450 A1* | 5/2009 | Kim | H01L 29/42324 257/325 |
| 2009/0212346 A1 | 8/2009 | Ino et al. | |
| 2010/0078704 A1 | 4/2010 | Ino et al. | |
| 2012/0068250 A1* | 3/2012 | Ino | H01L 29/66833 257/E21.21 |
| 2012/0281463 A1* | 11/2012 | Honjou | G11C 11/1655 365/158 |
| 2015/0380641 A1* | 12/2015 | Ino | G11C 11/22 257/295 |
| 2016/0005961 A1 | 1/2016 | Ino | |
| 2016/0351576 A1 | 12/2016 | Yamazaki et al. | |
| 2016/0365133 A1* | 12/2016 | Ino | G11C 11/223 |
| 2017/0018647 A1* | 1/2017 | Yamazaki | H01L 29/45 |
| 2017/0025544 A1* | 1/2017 | Yamazaki | H01L 29/24 |
| 2017/0133383 A1 | 5/2017 | Pandey et al. | |
| 2018/0233573 A1 | 8/2018 | Lin et al. | |
| 2018/0277647 A1* | 9/2018 | Yoo | H01L 29/516 |
| 2020/0212206 A1* | 7/2020 | Kim | H01L 29/66833 |

FOREIGN PATENT DOCUMENTS

| | | |
|---|---|---|
| JP | 2007-273548 A | 10/2007 |
| JP | 2009-200226 A | 9/2009 |
| JP | 2010-087089 A | 4/2010 |
| JP | WO2010/106922 A1 | 9/2010 |
| JP | 5531259 B2 | 6/2014 |
| JP | 2015-015334 A | 1/2015 |
| JP | 2015-065251 A | 4/2015 |
| JP | 2016-225614 A | 12/2016 |
| JP | 6096902 B2 | 3/2017 |
| WO | WO 2010/106922 A1 | 9/2010 |

OTHER PUBLICATIONS

Xu et al., "Ferroelectric phase stabilization of $HfO_2$ by nitrogen doping", Applied Physics Express 9, 091501, 2016, 5 pages.

* cited by examiner

BB' CROSS SECTION

AA' CROSS SECTION

SEMICONDUCTOR MEMORY DEVICE

CROSS-REFERENCE TO RELATED APPLICATION

This application is based upon and claims the benefit of priority from Japanese Patent Application No. 2020-049900, filed on Mar. 19, 2020, the entire contents of which are incorporated herein by reference.

FIELD

Embodiments described herein relate generally to a semiconductor memory device.

BACKGROUND

A three-dimensional NAND flash memory in which memory cells are three-dimensionally disposed realizes high integration and low cost. In the three-dimensional NAND flash memory, for example, a memory hole penetrating a stacked body is formed in the stacked body in which a plurality of insulating layers and a plurality of gate electrode layers are alternately stacked. By forming a charge storage layer and a semiconductor layer in the memory hole, a memory string in which a plurality of memory cells are connected in series is formed. Data is stored in the memory cell by controlling the amount of charge held in the charge storage layer.

It is desired to reduce a diameter of the memory hole for scaling-down of the memory cell. Along with the reduction of the diameter of the memory hole, it is desired to reduce a thickness of the charge storage layer. In order to realize the reduction of the thickness of the charge storage layer, it is necessary to improve the charge storage capacity per unit thickness of the charge storage layer, that is, charge storage density of the charge storage layer.

DETAILED DESCRIPTION

Figure 1:
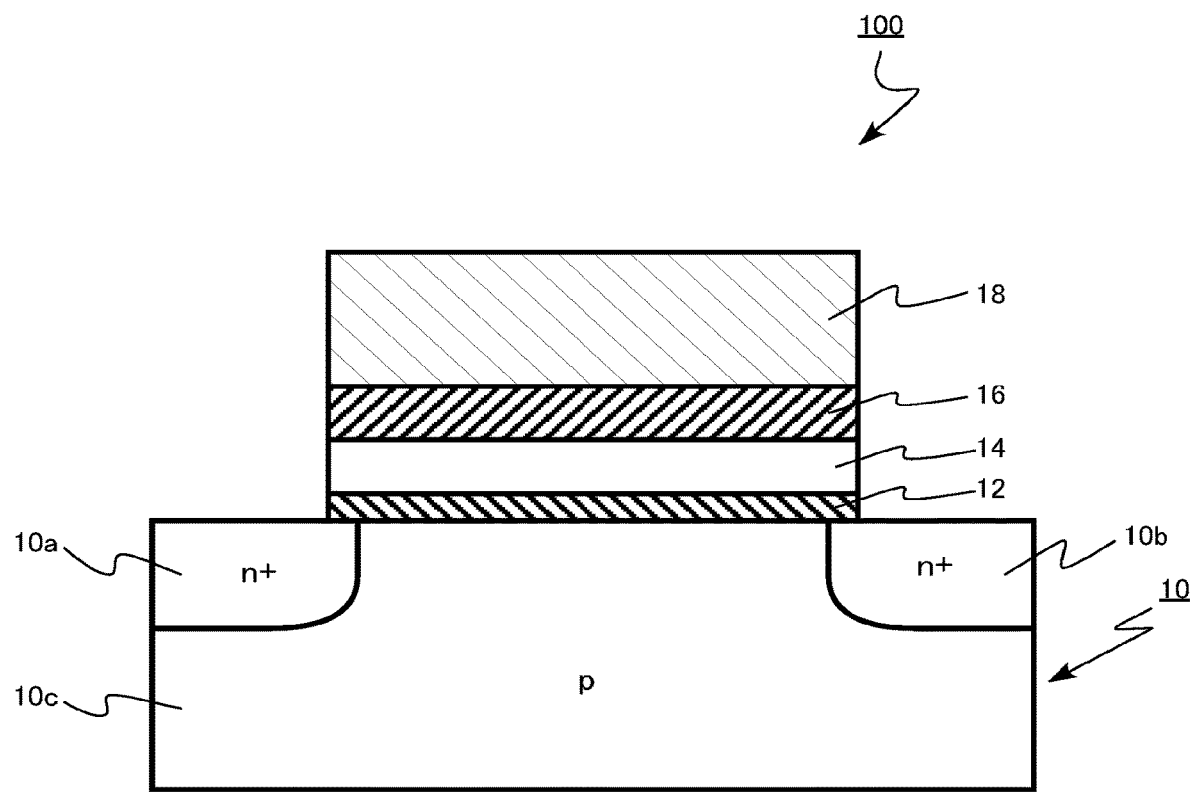
FIG. 1 is a schematic cross-sectional view of a semiconductor memory device of a first embodiment.

A semiconductor memory device of an embodiment includes: a semiconductor layer; a gate electrode layer; a first insulating layer provided between the semiconductor layer and the gate electrode layer; a second insulating layer provided between the first insulating layer and the gate electrode layer; and an intermediate layer provided between the first insulating layer and the second insulating layer, the intermediate layer containing a first crystal of a space group Pbca (space group number 61), a space group $P4_2/nmc$ (space group number 137), or a space group R-3m (space group number 166), and the intermediate layer containing hafnium (Hf), oxygen (O), and nitrogen (N).

Hereinafter, embodiments of the present disclosure will be described with reference to the drawings. In the following description, the same or equivalent members and the like will be denoted by the same reference numerals, and members that have been once described will not be described as appropriate.

In the present specification, the term "above" or "below" may be used for the sake of convenience. The term "above" or "below" is merely a term indicating a relative positional relationship within a drawing and is not a term that defines a positional relationship with respect to gravity.

Qualitative analysis and quantitative analysis of chemical compositions of the members forming the semiconductor memory device in the present specification can be carried out by secondary ion mass spectroscopy (SIMS), energy dispersive X-ray spectroscopy (EDX), electron energy loss spectroscopy (EELS), and the like. In addition, it is possible to use a transmission electron microscope (TEM), for example, for measurement of a thickness of the member forming the semiconductor memory device, a distance between members, and the like. For example, it is possible to use a transmission electron microscope, X-ray diffraction (XRD), electron beam diffraction (EBD), X-ray photoelectron spectroscopy (XPS), and a synchrotron radiation X-ray absorption fine structure (XAFS) to identify a crystal system of the member forming the semiconductor memory device and to compare the magnitude of an existence ratio of the crystal system. For example, TEM can be used to confirm the presence or absence of an orientation structure of the member forming the semiconductor memory device.

First Embodiment

A semiconductor memory device of a first embodiment includes: a semiconductor layer; a gate electrode layer; a first insulating layer provided between the semiconductor layer and the gate electrode layer; a second insulating layer provided between the first insulating layer and the gate electrode layer; and an intermediate layer provided between the first insulating layer and the second insulating layer, the intermediate layer containing a first crystal of a space group Pbca (space group number 61), a space group $P4_2/nmc$ (space group number 137), or a space group R-3m (space group number 166), and the intermediate layer containing hafnium (Hf), oxygen (O), and nitrogen (N).

FIG. 1 is a schematic cross-sectional view of the semiconductor memory device of the first embodiment. The semiconductor memory device of the first embodiment is a charge trap memory cell 100 that traps a charge in a charge storage layer.

The memory cell 100 of the first embodiment includes a semiconductor layer 10, a tunnel insulating layer 12, a charge storage layer 14, a block insulating layer 16, and a gate electrode layer 18. The tunnel insulating layer 12 is an example of a first insulating layer. The charge storage layer 14 is an example of an intermediate layer. The block insulating layer 16 is an example of a second insulating layer. The semiconductor layer 10 has a source region 10a, a drain region 10b, and a channel region 10c.

The semiconductor layer 10 is, for example, single crystal silicon.

The source region 10a is provided in the semiconductor layer 10. The source region 10a is, for example, an n-type impurity region. The drain region 10b is provided in the semiconductor layer 10. The drain region 10b is, for example, an n-type impurity region. The channel region 10c is provided in the semiconductor layer 10. The channel region 10c is, for example, a p-type impurity region.

The tunnel insulating layer 12 is provided on the semiconductor layer 10. The tunnel insulating layer 12 is provided between the semiconductor layer 10 and the gate electrode layer 18.

The tunnel insulating layer 12 has a function of allowing passage of a charge according to a voltage applied between the gate electrode layer 18 and the semiconductor layer 10.

The tunnel insulating layer 12 is, for example, an oxide, an oxynitride, or a nitride. The tunnel insulating layer 12 includes, for example, silicon oxide, silicon oxynitride, or silicon nitride. A thickness of the tunnel insulating layer 12 is, for example, 3 nm or more and 8 nm or less.

The charge storage layer 14 is provided on the tunnel insulating layer 12. The charge storage layer 14 is disposed between the tunnel insulating layer 12 and the block insulating layer 16.

The charge storage layer 14 has a function of trapping and storing a charge. The charge is, for example, an electron. A threshold voltage of a transistor of the memory cell 100 changes according to the amount of the charge stored in the charge storage layer 14. As the change of the threshold voltage is used, the memory cell 100 can store data.

For example, a voltage at which the transistor of the memory cell 100 is turned on changes as the threshold voltage of the transistor of the memory cell 100 changes. For example, when a state where the threshold voltage is high is defined as data "0" and a state where the threshold voltage is low is defined as data "1", the memory cell can store a 1-bit data of "0" and "1".

The charge storage layer 14 contains the first crystal of the space group Pbca (space group number 61), the space group $P4_2/nmc$ (space group number 137), or the space group R-3m (space group number 166). The charge storage layer 14 contains hafnium (Hf), oxygen (O), and nitrogen (N).

The first crystal is hafnium oxide. Hafnium oxide of the space group Pbca (space group number 61) is an antiferroelectric substance. Hafnium oxide of the space group $P4_2/nmc$ (space group number 137) is an antiferroelectric substance. Hafnium oxide of the space group R-3m (space group number 166) is an antiferroelectric substance. The charge storage layer 14 is an antiferroelectric layer.

The charge storage layer 14 has hafnium oxide as a main component. Having the hafnium oxide as the main component means that the hafnium oxide occupies the highest proportion among components contained in the charge storage layer 14. The charge storage layer 14 is an antiferroelectric hafnium oxide layer.

An atomic ratio of hafnium (Hf) and oxygen (O) among elements contained in the charge storage layer 14 is, for example, 90% or more.

An atomic ratio of hafnium (Hf), zirconium (Zr), and oxygen (O) among the elements contained in the charge storage layer 14 is, for example, 90% or more.

An atomic ratio (N/(Hf+O+N)) of nitrogen (N) to the sum of hafnium (Hf), oxygen (O), and nitrogen (N) contained in the charge storage layer 14 is, for example, 1.5% or more and 3.0% or less.

A thickness of the charge storage layer 14 is, for example, 2 nm or more and 10 nm or less.

Figure 2:
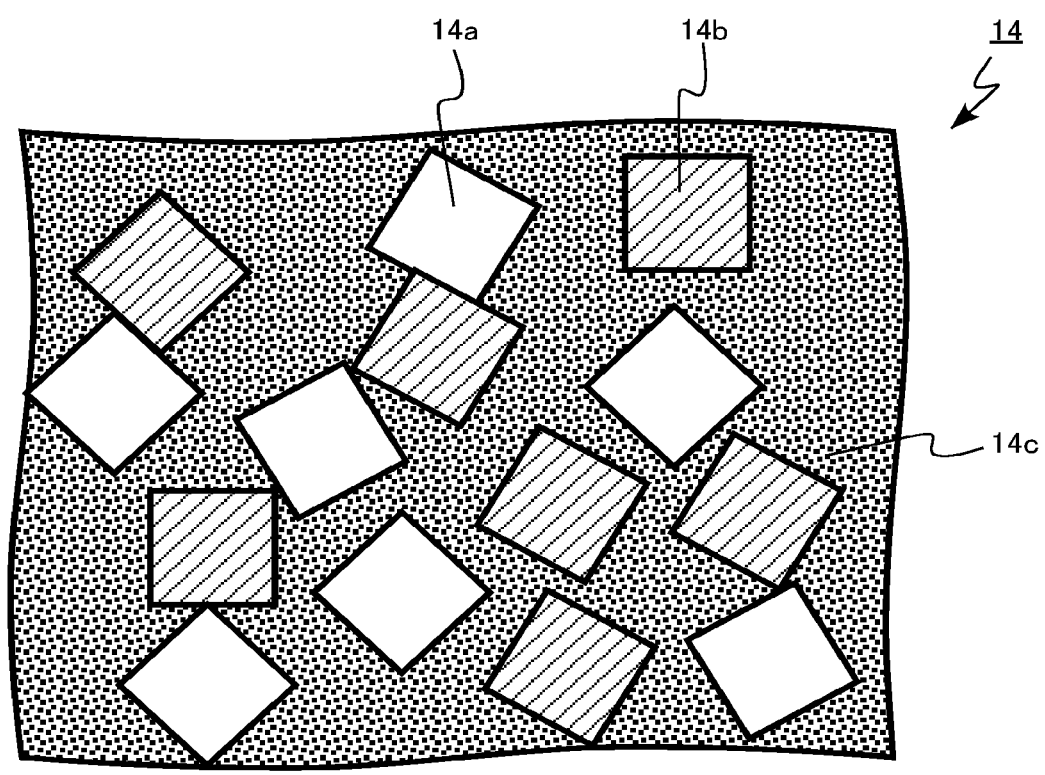
FIG. 2 is a schematic cross-sectional view of a part of a charge storage layer of the first embodiment.

FIG. 2 is a schematic cross-sectional view of a part of the charge storage layer of the first embodiment. The charge storage layer 14 includes, for example, a first crystal 14a, a second crystal 14b, and an amorphous region 14c.

The first crystal 14a is hafnium oxide of the space group Pbca (space group number 61) or the space group $P4_2/nmc$ (space group number 137).

The second crystal 14b is, for example, hafnium oxide of a space group $P2_1c$ (space group number 14). The hafnium oxide of the space group $P2_1c$ (space group number 14) is a paraelectric substance.

As illustrated in FIG. 2, for example, antiferroelectric hafnium oxide, paraelectric hafnium oxide, and the amorphous region are mixed in the charge storage layer 14. In addition, there may be a case where only the antiferroelectric hafnium oxide and the amorphous region are mixed.

The charge storage layer 14 can have only the antiferroelectric hafnium oxide. In this case, the charge storage layer 14 is a polycrystalline layer of the antiferroelectric hafnium oxide.

In addition, the charge storage layer 14 may have only the antiferroelectric hafnium oxide and the paraelectric hafnium oxide without the amorphous region. In this case, the charge storage layer 14 is a polycrystalline layer having the antiferroelectric hafnium oxide and the paraelectric hafnium oxide.

The block insulating layer 16 is provided between the tunnel insulating layer 12 and the gate electrode layer 18. The block insulating layer 16 is provided between the charge storage layer 14 and the gate electrode layer 18.

The block insulating layer 16 has a function of blocking a current flowing between the charge storage layer 14 and the gate electrode layer 18.

The block insulating layer 16 is, for example, an oxide, an oxynitride, or a nitride. The block insulating layer 16 includes, for example, silicon oxide or aluminum oxide.

The gate electrode layer 18 is metal or a semiconductor. The gate electrode layer 18 is, for example, polycrystalline silicon containing an n-type impurity or a p-type impurity.

For example, a NAND string of a NAND flash memory can be formed by connecting the memory cells 100 illustrated in FIG. 1 in series.

Next, an example of a method of manufacturing the semiconductor memory device of the first embodiment will be described.

First, a silicon oxide film is formed on a silicon substrate by a thermal oxidation method. The silicon substrate serves as the semiconductor layer 10. The silicon oxide film serves as the tunnel insulating layer 12.

Next, a hafnium oxide film containing nitrogen at 1.5% or more and 3.0% or less is formed on the silicon oxide film. The hafnium oxide film containing nitrogen is formed by, for example, a reactive sputtering method using a hafnium oxide target and a nitrogen gas. In order to control the content of nitrogen to an extremely small and narrow range, an oxygen gas flow rate and a nitrogen gas flow rate are precisely controlled, and a film forming device capable of maintaining an ultrahigh vacuum is used. The hafnium oxide film serves as the charge storage layer 14.

Next, a silicon oxide film is formed on the charge storage layer 14. The silicon oxide film is formed using a sputtering method which enables formation at a low temperature in order to prevent a nitrogen escape from the charge storage layer 14. The silicon oxide film serves as the block insulating layer 16.

Next, a polycrystalline silicon film containing a conductive impurity is formed. The polycrystalline silicon film is formed using a sputtering method which enables formation at a low temperature in order to prevent the nitrogen escape from the charge storage layer 14.

Next, the polycrystalline silicon film, the silicon oxide film, the hafnium oxide film, and the silicon oxide film are patterned to form a gate electrode structure.

Next, ion implantation of an impurity and activation annealing are performed on the silicon substrate to form the source region 10a and the drain region 10b. A temperature of activation annealing is set to 800° C. or lower in order to prevent the nitrogen escape from the charge storage layer 14 and to increase the proportion of the antiferroelectric substance in the charge storage layer 14.

With the precise control of the nitrogen concentration in the hafnium oxide film and the low-temperature heat treatment after the formation of the hafnium oxide film, the charge storage layer 14 having a high proportion of the antiferroelectric substance can be formed.

Next, a function and an effect of the semiconductor memory device of the first embodiment will be described.

In order for scaling-down of a memory cell, it is desired to reduce the thickness of the charge storage layer particularly in a memory cell array having a three-dimensional structure. In order to realize the reduction of the thickness of the charge storage layer, it is necessary to improve the charge storage capacity per unit thickness of the charge storage layer, that is, charge storage density of the charge storage layer. Even in a memory cell array having a two-dimensional structure, a gate length of a transistor of a memory cell can be shortened, for example, by improving the charge storage density of the charge storage layer, whereby the memory cell can be scaled down.

In the memory cell 100 of the first embodiment, the antiferroelectric hafnium oxide is applied to the charge storage layer 14. Since the antiferroelectric hafnium oxide is applied to the charge storage layer 14, the charge storage density of the charge storage layer 14 is improved.

Figure 3:
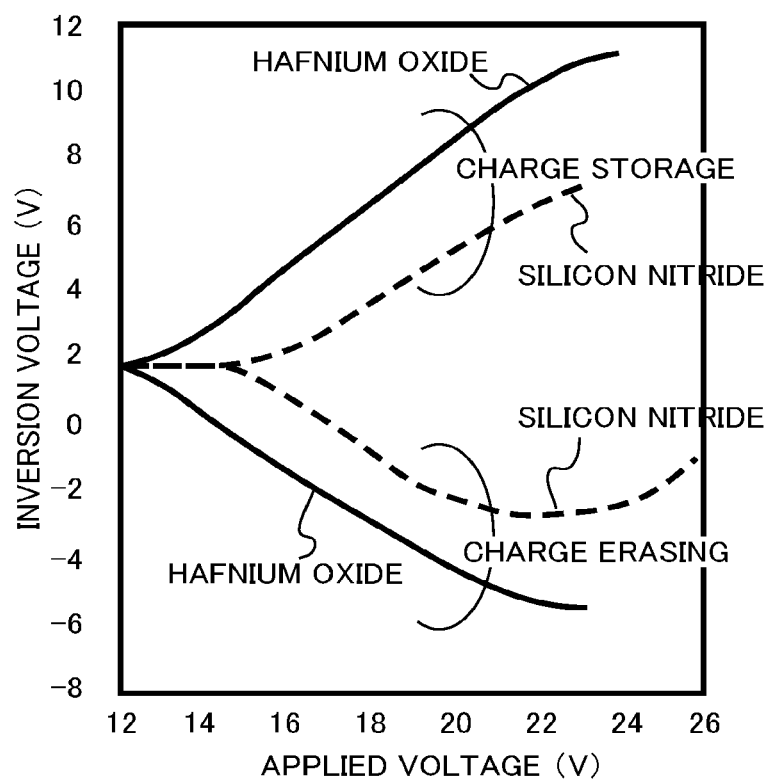
FIG. 3 is an explanatory view of a function and an effect of the semiconductor memory device of the first embodiment.

FIG. 3 is an explanatory view of the function and effect of the semiconductor memory device of the first embodiment. FIG. 3 illustrates a measurement result of a memory window when the antiferroelectric hafnium oxide is used for the charge storage layer.

The horizontal axis of FIG. 3 represents a voltage applied to the gate electrode layer, and the vertical axis represents an inversion voltage of the semiconductor layer. The vertical axis corresponds to the threshold voltage of the transistor. The inversion voltage is a positive voltage in a state where electrons (charges) are stored in the charge storage layer. In addition, the inversion voltage is a negative voltage in a state where electrons (charges) are erased. The memory window is a difference between the inversion voltage in the charge storage state and the inversion voltage in the charge erasing state.

FIG. 3 illustrates a case where the charge storage layer is the antiferroelectric hafnium oxide and a case where the charge storage layer is silicon nitride. A film thickness is 5 nm in both the cases.

As being clear from FIG. 3, the memory window in the case of the antiferroelectric hafnium oxide is significantly wider than the memory window in the case of the silicon nitride. It can be seen that the charge storage density of the antiferroelectric hafnium oxide is significantly higher than the charge storage density of the silicon nitride. For example, a memory window of paraelectric or ferroelectric hafnium oxide is equal to or lower than that of the silicon nitride.

Figure 4:
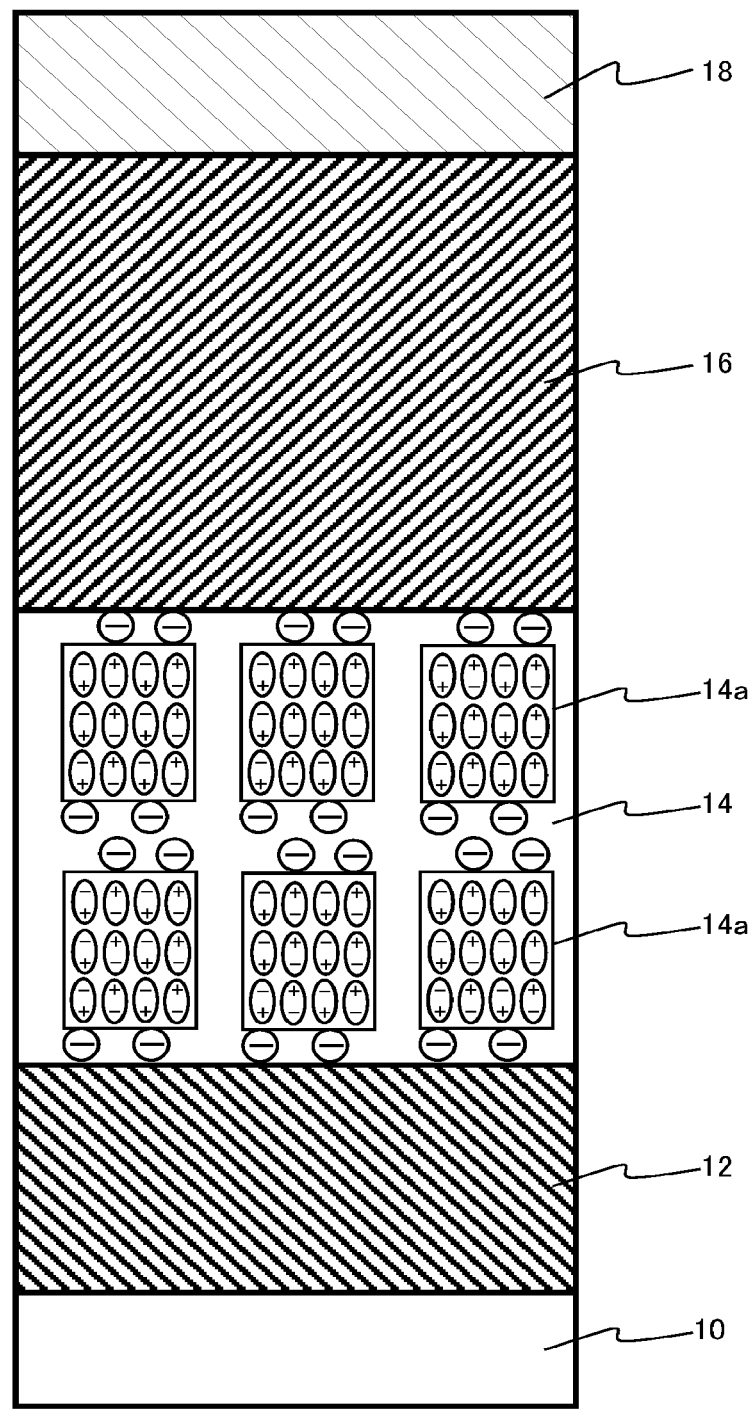
FIG. 4 is an explanatory view of the function and effect of the semiconductor memory device of the first embodiment.
Figure 5:
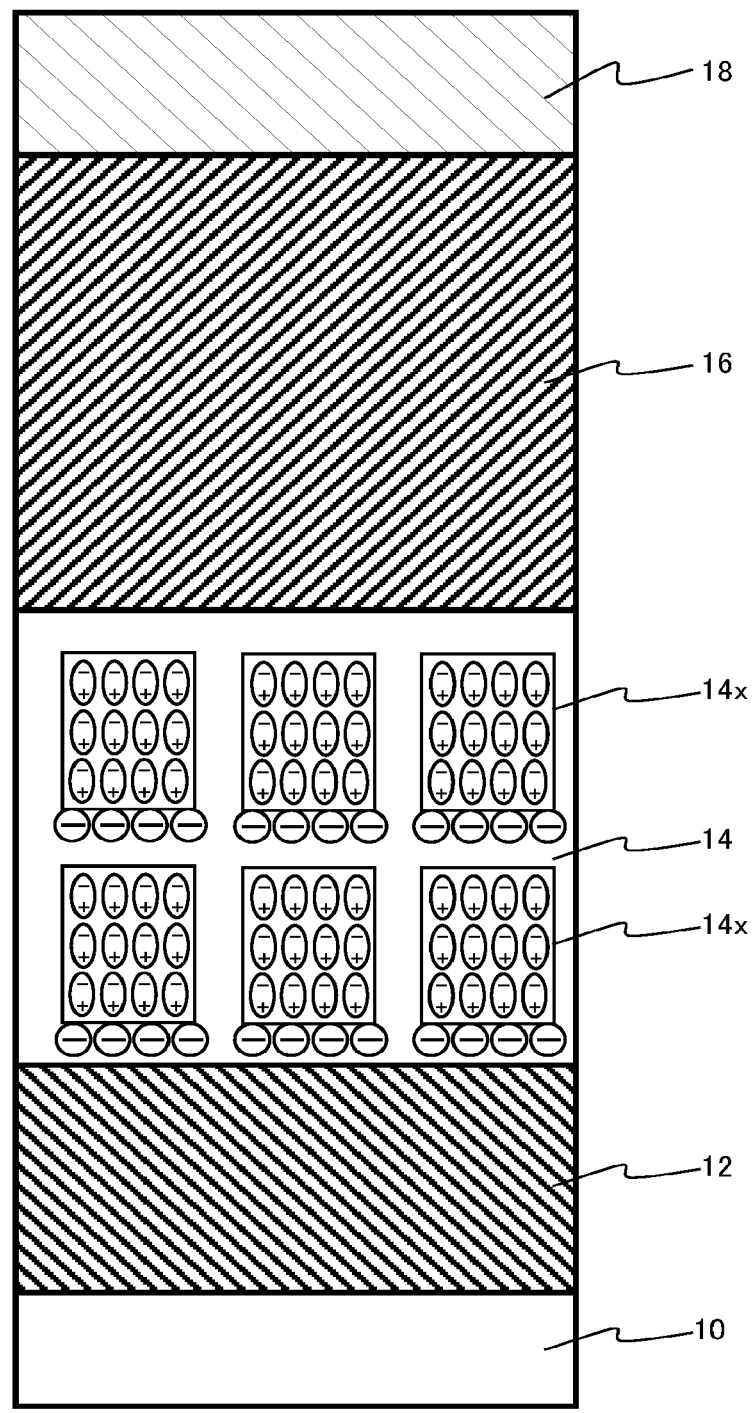
FIG. 5 is an explanatory view of the function and effect of the semiconductor memory device of the first embodiment.

FIGS. 4 and 5 are explanatory views of the function and effect of the semiconductor memory device of the first embodiment.

FIG. 4 is the explanatory view of the charge storage state of the memory cell 100 of the first embodiment. FIG. 4 is an enlarged schematic cross-sectional view of the vicinity of the charge storage layer 14 of the memory cell 100.

The charge storage layer 14 contains antiferroelectric hafnium oxide crystals 14a. In the charge storage state, electric dipoles in the hafnium oxide crystal 14a are alternately aligned in opposite directions. At an interface between the hafnium oxide crystals 14a, electrons are trapped on the positive charge side of the electric dipole. The trapped electrons cause a shift of the threshold voltage of the transistor of the memory cell 100. Since the density of electrons trapped on the positive charge side of the electric dipole is high, it is considered that the charge storage density of the antiferroelectric hafnium oxide increases.

FIG. 5 is an explanatory view of a charge storage state of a memory cell of a comparative example of the first embodiment. In the memory cell of the comparative example, the charge storage layer 14 includes ferroelectric hafnium oxide crystals 14x. In the charge storage state, the electric dipoles in the hafnium oxide crystal 14x are aligned such that a side of the semiconductor layer 10 has a positive charge and a side of the gate electrode layer 18 has a negative charge.

At an interface between the hafnium oxide crystals 14x, electrons are trapped on the positive charge side of the electric dipole. However, the trapped charge is offset by a macroscopic polarized charge formed by the electric dipoles aligned in one direction. Accordingly, a threshold voltage shift of a transistor caused by the trapped charge becomes smaller than that in the case of the antiferroelectric hafnium oxide.

In the antiferroelectric hafnium oxide, no macroscopic polarized charge occurs since the electric dipoles in the hafnium oxide crystal 14a are alternately disposed in opposite directions. Therefore, the trapped charge is not offset by the macroscopic polarized charge.

Since the charge storage layer 14 contains the antiferroelectric hafnium oxide according to the memory cell 100 of the first embodiment, the charge storage density of the charge storage layer 14 can be improved.

From the viewpoint of increasing the proportion of the antiferroelectric hafnium oxide in the charge storage layer 14, an atomic ratio of nitrogen (N) to the sum of hafnium (Hf), oxygen (O), and nitrogen (N) contained in the charge storage layer 14 is preferably 1.5% or more and 3.0% or less.

From the viewpoint of improving the charge storage density of the charge storage layer 14, it is preferable to increase the proportion of antiferroelectric hafnium oxide in the charge storage layer 14. Meanwhile, energy, required for detrapping of the electrons trapped at the interface between the crystals of the antiferroelectric substance, is likely to increase. Therefore, if the proportion of the antiferroelectric hafnium oxide in the charge storage layer 14 becomes too high, an erase characteristic of the memory cell 100 is likely to be degraded.

From the viewpoint of improving the erase characteristic of the memory cell 100, the charge storage layer 14 preferably contains a paraelectric substance. For example, the charge storage layer 14 preferably contains a hafnium oxide crystal of the space group P2$_1$c (space group number 14). From the viewpoint of improving the erase characteristic of the memory cell 100, the charge storage layer 14 preferably contains the amorphous region 14c.

Charge trap films including Pbca type or P4$_2$/nmc type of hafnium oxide or oxynitride crystals is suitable for the memory cell type which has common continuous charge trap film together with the next memory cells, because trapped charges on the antiferroelectric Pbca type or P4$_2$/nmc type microcrystals cannot move from the trapped sites. Therefore these antiferroelectric Pbca type or P4$_2$/nmc type microcrystals well prevents trapped charges from moving to the next memory cells.

As described above, the semiconductor memory device capable of improving the charge storage density of the charge storage layer can be realized according to the first embodiment.

Second Embodiment

A semiconductor memory device of a second embodiment is different from the semiconductor memory device of the first embodiment in terms of further including a first silicon nitride layer provided between a first insulating layer and an intermediate layer and a second silicon nitride layer provided between the intermediate layer and a second insulating layer. Hereinafter, some of the content overlapping with that in the first embodiment will not be described.

Figure 6:
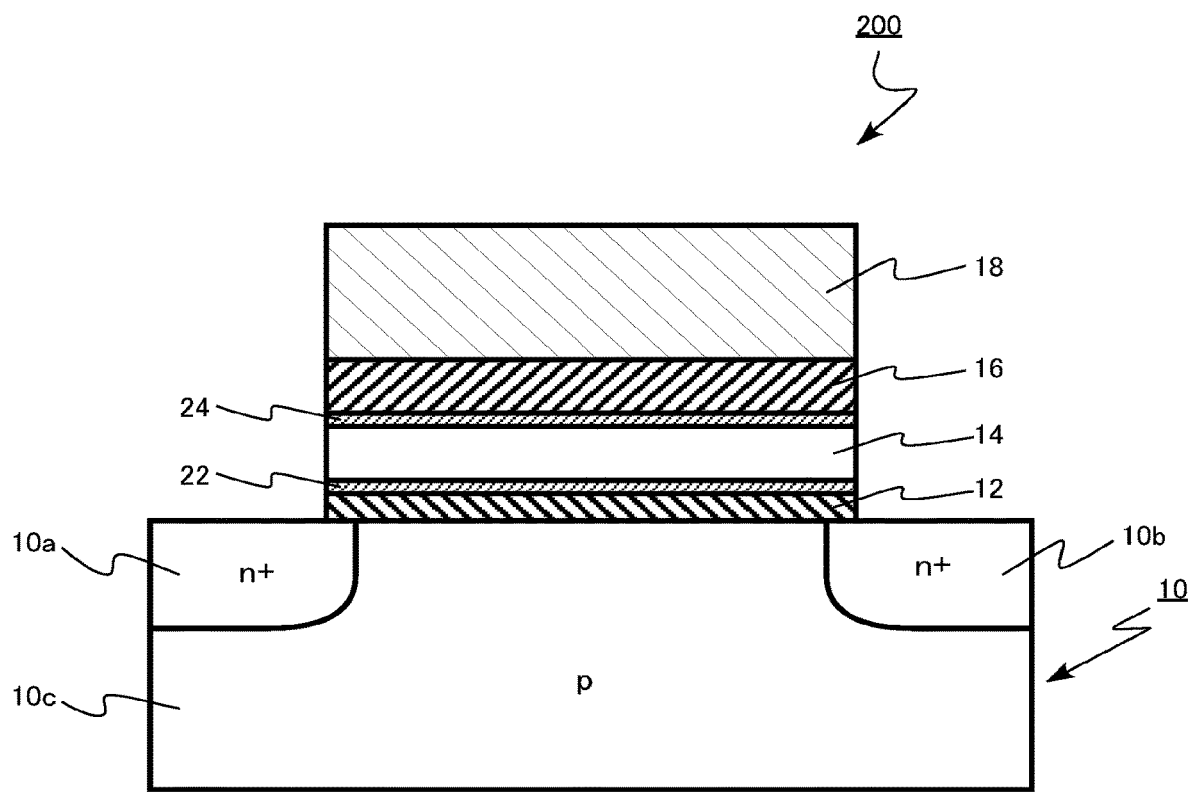
FIG. 6 is a schematic cross-sectional view of a semiconductor memory device of a second embodiment.

FIG. 6 is a schematic cross-sectional view of the semiconductor memory device of the second embodiment. The semiconductor memory device of the second embodiment is a charge trap memory cell 200 that traps a charge in a charge storage layer.

A memory cell 200 of the second embodiment includes the semiconductor layer 10, the tunnel insulating layer 12, the charge storage layer 14, the block insulating layer 16, the gate electrode layer 18, a first silicon nitride layer 22, and a second silicon nitride layer 24. The tunnel insulating layer 12 is an example of a first insulating layer. The charge storage layer 14 is an example of an intermediate layer. The block insulating layer 16 is an example of a second insulating layer. The semiconductor layer 10 has a source region 10a, a drain region 10b, and a channel region 10c.

The first silicon nitride layer 22 is provided between the tunnel insulating layer 12 and the charge storage layer 14. The first silicon nitride layer 22 has a function of suppressing an escape of nitrogen from the charge storage layer 14 during formation of the charge storage layer 14 and after the formation.

A thickness of the first silicon nitride layer 22 is thinner than a thickness of the charge storage layer 14, for example. The thickness of the first silicon nitride layer 22 is, for example, 0.5 nm or more and 2 nm or less.

The second silicon nitride layer 24 is provided between the charge storage layer 14 and the block insulating layer 16. The second silicon nitride layer 24 has a function of suppressing an escape of nitrogen from the charge storage layer 14 after the formation of the charge storage layer 14.

A thickness of the second silicon nitride layer 24 is thinner than a thickness of the charge storage layer 14, for example. The thickness of the second silicon nitride layer 24 is, for example, 0.5 nm or more and 2 nm or less.

The memory cell 200 of the second embodiment includes the first silicon nitride layer 22 and the second silicon nitride layer 24, so that the content of nitrogen in the charge storage layer 14 can be easily controlled. Therefore, it becomes easy to manufacture the memory cell 200 capable of improving the charge storage density of the charge storage layer.

As described above, the semiconductor memory device capable of improving the charge storage density of the charge storage layer can be realized according to the second embodiment. In addition, it becomes easy to manufacture the semiconductor memory device capable of improving the charge storage density of the charge storage layer.

Third Embodiment

A semiconductor memory device of a third embodiment includes: a plurality of gate electrode layers spaced apart from each other and arranged in a first direction; a semiconductor layer extending in the first direction; a first insulating layer provided between the semiconductor layer and at least one gate electrode layer of the gate electrode layers; a second insulating layer provided between the first insulating layer and the at least one gate electrode layer; and an intermediate layer provided between the first insulating layer and the second insulating layer, the intermediate layer containing a first crystal of a space group Pbca (space group number 61), a space group P4$_2$/nmc (space group number 137), or a space group R-3m (space group number 166), and the intermediate layer containing hafnium (Hf), oxygen (O), and nitrogen (N). The semiconductor memory device of the third embodiment is different from that of the first embodiment in terms that a structure similar to that of the memory cell of the first embodiment is applied to a three-dimensional NAND flash memory. Hereinafter, some of the content overlapping with that in the first embodiment will not be described.

The semiconductor memory device of the third embodiment is a three-dimensional NAND flash memory. The memory cell of the semiconductor memory device of the third embodiment is a so-called charge trap memory cell.

Figure 7:
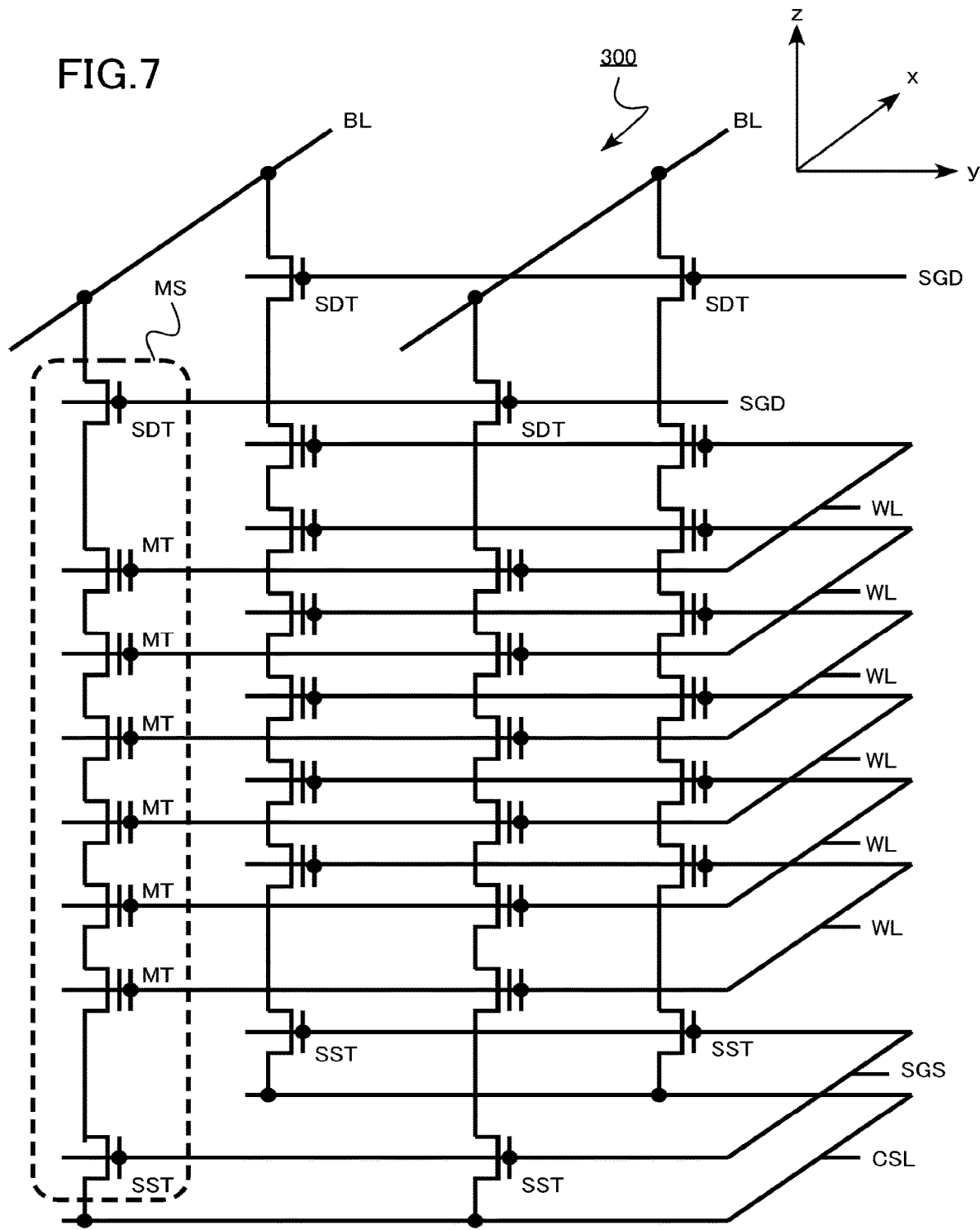
FIG. 7 is a circuit diagram of a memory cell array of a semiconductor memory device of a third embodiment.

FIG. 7 is a circuit diagram of a memory cell array of the semiconductor memory device of the third embodiment.

As illustrated in FIG. 7, a memory cell array 300 of the three-dimensional NAND flash memory of the third embodiment includes a plurality of word lines WL, a common source line CSL, a source selection gate line SGS, a plurality of drain selection gate lines SGD, a plurality of bit lines BL, and a plurality of the memory strings MS. The word line WL is an example of the gate electrode layer.

The plurality of word lines WL are disposed to be spaced apart from each other in a z direction. The plurality of word lines WL are stacked and disposed in the z direction. The plurality of memory strings MS extend in the z direction. The plurality of bit lines BL extend in the x direction, for example.

Hereinafter, an x direction is defined as a second direction, a y direction is defined as a third direction, and the z direction is defined as a first direction. The x direction, the y direction, and the z direction are, for example, orthogonal to each other.

As illustrated in FIG. 7, the memory string MS includes a source selection transistor SST, a plurality of memory cells, and a drain selection transistor SDT which are connected in series between the common source line CSL and the bit line BL. The single memory string MS is selected by selecting one bit line BL and one drain selection gate line SGD, and the single memory cell can be selected by selecting one word line WL. The word line WL is a gate electrode of a memory cell transistor MT that forms the memory cell.

Figure 8A:
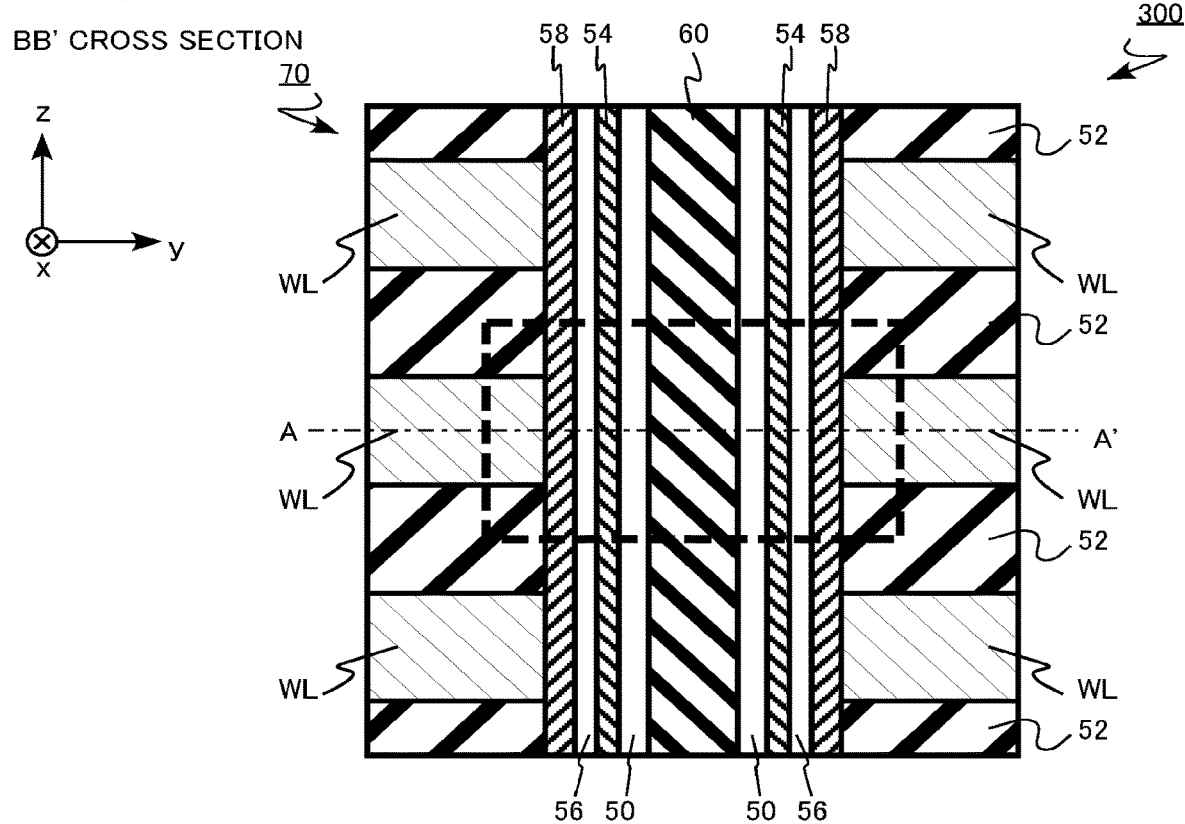
FIGS. 8A and 8B are schematic cross-sectional views of a memory cell array of the semiconductor memory device of the third embodiment.
Figure 8B:
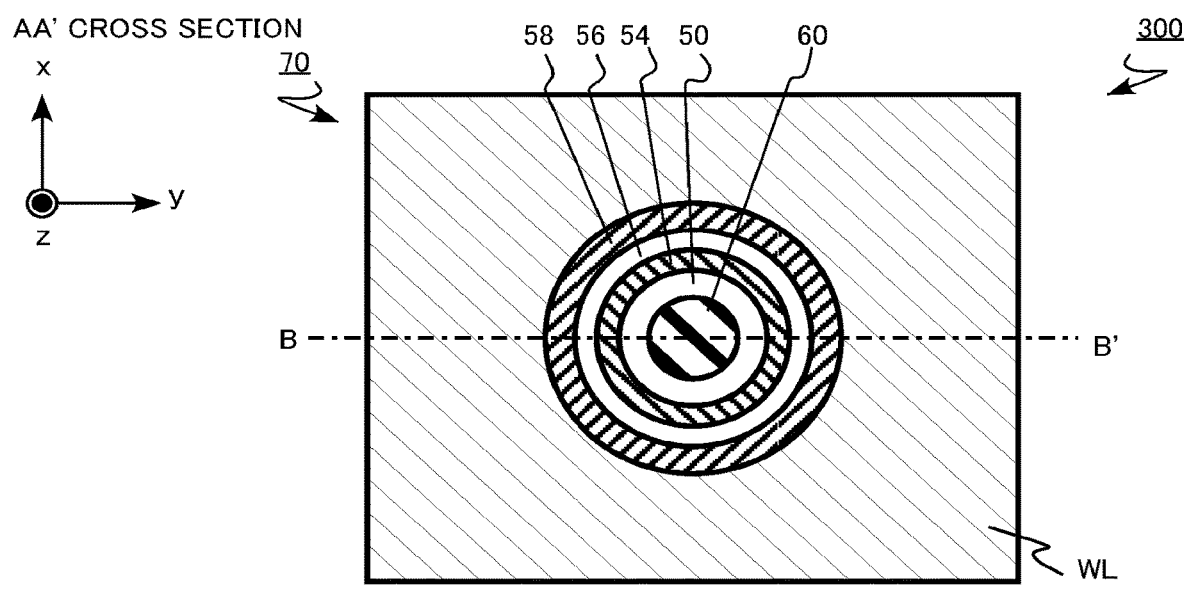

FIGS. 8A and 8B are schematic cross-sectional views of the memory cell array of the semiconductor memory device of the third embodiment. FIGS. 8A and 8B illustrate cross sections of a plurality of memory cells in the single memory string MS surrounded by, for example, a dotted line in the memory cell array 300 of FIG. 7.

FIG. 8A is a yz cross-sectional view of the memory cell array 300. FIG. 8A is a BB' cross section of FIG. 8B. FIG. 8B is an xy cross-sectional view of the memory cell array 300. FIG. 8B is an AA' cross section of FIG. 8A. In FIG. 8A, a region surrounded by the broken line corresponds to one memory cell.

As illustrated in FIGS. 8A and 8B, the memory cell array 300 includes the plurality of word lines WL, a semiconductor layer 50, a plurality of interlayer insulating layers 52, a tunnel insulating layer 54, a charge storage layer 56, a block insulating layer 58, and a core insulating region 60.

The plurality of word lines WL and the plurality of interlayer insulating layers 52 form a stacked body 70.

The word line WL is an example of the gate electrode layer. The tunnel insulating layer 54 is an example of the first insulating layer. The charge storage layer 56 is an example of the intermediate layer. The block insulating layer 58 is an example of the second insulating layer.

The memory cell array 300 is provided, for example, on a semiconductor substrate (not illustrated). The semiconductor substrate has a surface parallel to the x direction and the y direction.

The word line WL and the interlayer insulating layer 52 are alternately stacked in the z direction (first direction) on the semiconductor substrate. The word lines WL are disposed to be spaced apart from each other in the z direction. The word lines WL are arranged in the z direction to be spaced apart from each other. The plurality of word lines WL and the plurality of interlayer insulating layers 52 form a stacked body 70. The word line WL functions as a control electrode of the memory cell transistor MT.

The word line WL is a plate-shaped conductor. The word line WL is, for example, metal, a metal nitride, a metal carbide, or a semiconductor. The word line WL is, for example, tungsten (W). A thickness of the word line WL in the z direction is, for example, 5 nm or more and 20 nm or less.

The interlayer insulating layer 52 separates the word line WL and the word line WL. The interlayer insulating layer 52 electrically separates the word line WL from the word line WL.

The interlayer insulating layer 52 is, for example, an oxide, an oxynitride, or a nitride. The interlayer insulating layer 52 is, for example, silicon oxide. A thickness of the interlayer insulating layer 52 in the z direction is, for example, 5 nm or more and 20 nm or less.

The semiconductor layer 50 is provided in the stacked body 70. The semiconductor layer 50 extends in the z direction. The semiconductor layer 50 extends in a direction orthogonal to the surface of the semiconductor substrate.

The semiconductor layer 50 is provided to penetrate through the stacked body 70. The semiconductor layer 50 is surrounded by the plurality of word lines WL. The semiconductor layer 50 has, for example, a cylindrical shape. The semiconductor layer 50 functions as a channel of the memory cell transistor MT.

The semiconductor layer 50 is, for example, a polycrystalline semiconductor. The semiconductor layer 50 is, for example, polycrystalline silicon.

The tunnel insulating layer 54 is provided between the semiconductor layer 50 and the word line WL. The tunnel insulating layer 54 is provided between the semiconductor layer 50 and at least one of the plurality of word lines WL. The tunnel insulating layer 54 is provided between the semiconductor layer 50 and the charge storage layer 56.

The tunnel insulating layer 54 has a function of allowing passage of a charge according to a voltage applied between the word line WL and the semiconductor layer 50.

The tunnel insulating layer 54 is, for example, an oxide, an oxynitride, or a nitride. The tunnel insulating layer 12 includes, for example, silicon oxide, silicon oxynitride, or silicon nitride. A thickness of the tunnel insulating layer 12 is, for example, 3 nm or more and 8 nm or less.

The charge storage layer 56 is provided between the tunnel insulating layer 54 and the block insulating layer 58.

The charge storage layer 56 has a function of trapping and storing a charge. The charge is, for example, an electron. A threshold voltage of the memory cell transistor MT changes according to the amount of the charge stored in the charge storage layer 56. As the change of the threshold voltage is used, one memory cell can store data.

For example, a voltage at which the memory cell transistor MT is turned on changes as the threshold voltage of the memory cell transistor MT changes. For example, when a state where the threshold voltage is high is defined as data "0" and a state where the threshold voltage is low is defined as data "1", the memory cell can store a 1-bit data of "0" and "1".

The charge storage layer 56 contains the first crystal of the space group Pbca (space group number 61), the space group P4$_2$/nmc (space group number 137), or the space group R-3m (space group number 166). The charge storage layer 14 contains hafnium (Hf), oxygen (O), and nitrogen (N).

The first crystal is hafnium oxide. Hafnium oxide of the space group Pbca (space group number 61) is an antiferroelectric substance. Hafnium oxide of the space group P4$_2$/nmc (space group number 137) is an antiferroelectric substance. Hafnium oxide of the space group R-3m (space group number 166) is an antiferroelectric substance. The charge storage layer 14 is an antiferroelectric layer.

The charge storage layer 56 has hafnium oxide as a main component. Having the hafnium oxide as the main component means that the hafnium oxide occupies the highest proportion among components contained in the charge storage layer 56. The charge storage layer 56 is an antiferroelectric hafnium oxide layer.

An atomic ratio of hafnium (Hf) and oxygen (O) among elements contained in the charge storage layer 56 is, for example, 90% or more.

An atomic ratio of hafnium (Hf), zirconium (Zr), and oxygen (O) among the elements contained in the charge storage layer 14 is, for example, 90% or more.

An atomic ratio (N/(Hf+O+N)) of nitrogen (N) to the sum of hafnium (Hf), oxygen (O), and nitrogen (N) contained in the charge storage layer 56 is 1.5% or more and 3.0% or less.

A thickness of the charge storage layer 56 is, for example, 2 nm or more and 10 nm or less.

When a hafnium oxide film containing nitrogen at, for example, 1.5% or more and 3.0% or less is formed as the charge storage layer 56, an atomic layer deposition (ALD) method, for example, is used for the formation. For example, it is possible to use a method of forming, for example, fourteen layers of HfO$_2$, using a hafnium precursor such as tetrakis (dimethylamido) hafnium (IV) and using H$_2$O or the like as an oxidizing gas, forming, for example, one layer of HfN using a hafnium precursor such as hafnium (IV) chloride and using NH$_3$ or the like as a nitriding gas, and forming, for example, fourteen layers of HfO$_2$ again using a hafnium precursor such as tetrakis (dimethylamido) hafnium (IV) and use $H_2O$ or the like as an oxidizing gas. Annealing may be performed after deposition at any one step or a plurality of steps after each formation step. As the $HfO_2$ layer and the HfN layer are mixed, a hafnium oxide film containing nitrogen at 1.5% or more and 3.0% or less is generated. Even when an additive other than nitrogen is used, the composition may be similarly controlled by controlling a ratio of the number of stacked $HfO_2$ layers and the number of stacked layers of the additive.

The block insulating layer 58 is provided between the tunnel insulating layer 54 and the word line WL. The block insulating layer 58 is provided between the charge storage layer 56 and the word line WL. The block insulating layer 58 has a function of blocking a current flowing between the charge storage layer 56 and the word line WL.

The block insulating layer 58 is, for example, an oxide, an oxynitride, or a nitride. The block insulating layer 58 includes, for example, silicon oxide or aluminum oxide.

The core insulating region 60 is provided in the stacked body 70. The core insulating region 60 extends in the z direction. The core insulating region 60 is provided to penetrate through the stacked body 70. The core insulating region 60 is surrounded by the semiconductor layer 50. The core insulating region 60 is surrounded by the plurality of word lines WL. The core insulating region 60 has a pillar shape. The core insulating region 60 has, for example, a cylindrical shape.

The core insulating region 60 is, for example, an oxide, an oxynitride, or a nitride. The core insulating region 60 is, for example, silicon oxide.

The charge storage layer 56 of the three-dimensional NAND flash memory of the third embodiment contains the antiferroelectric hafnium oxide. Therefore, the charge storage density of the charge storage layer 56 is improved. Therefore, it is possible to reduce the thickness of the charge storage layer 56 and to reduce a memory hole diameter. Accordingly, it is possible to scale down the memory cell and to further increase the memory capacity.

As described above, the semiconductor memory device capable of improving the charge storage density of the charge storage layer can be realized according to the third embodiment similarly to the first embodiment. Further, it is possible to scale down the memory cell and to further Increase the memory capacity.

Fourth Embodiment

A semiconductor memory device of a fourth embodiment includes: a semiconductor layer; a gate electrode; a first insulating layer provided between the semiconductor layer and the gate electrode; a second insulating layer provided between the first insulating layer and the gate electrode; and an intermediate layer provided between the first insulating layer and the second insulating layer, the intermediate layer containing a first crystal of a space group Pbca (space group number 61), a space group $P4_2/nmc$ (space group number 137), or a space group R-3m (space group number 166), and the intermediate layer containing hafnium (Hf), oxygen (O), and at least one element selected from a group consisting of silicon (Si), germanium (Ge), aluminum (Al), strontium (Sr), niobium (Nb), tantalum (Ta), molybdenum (Mo), tungsten (W), yttrium (Y), lanthanoid, ruthenium (Ru), and barium (Ba). The semiconductor memory device of the fourth embodiment is different from the semiconductor memory device of the first embodiment in terms that a material of an intermediate layer is different. Hereinafter, some of the content overlapping with that in the first embodiment will not be described.

Figure 9:
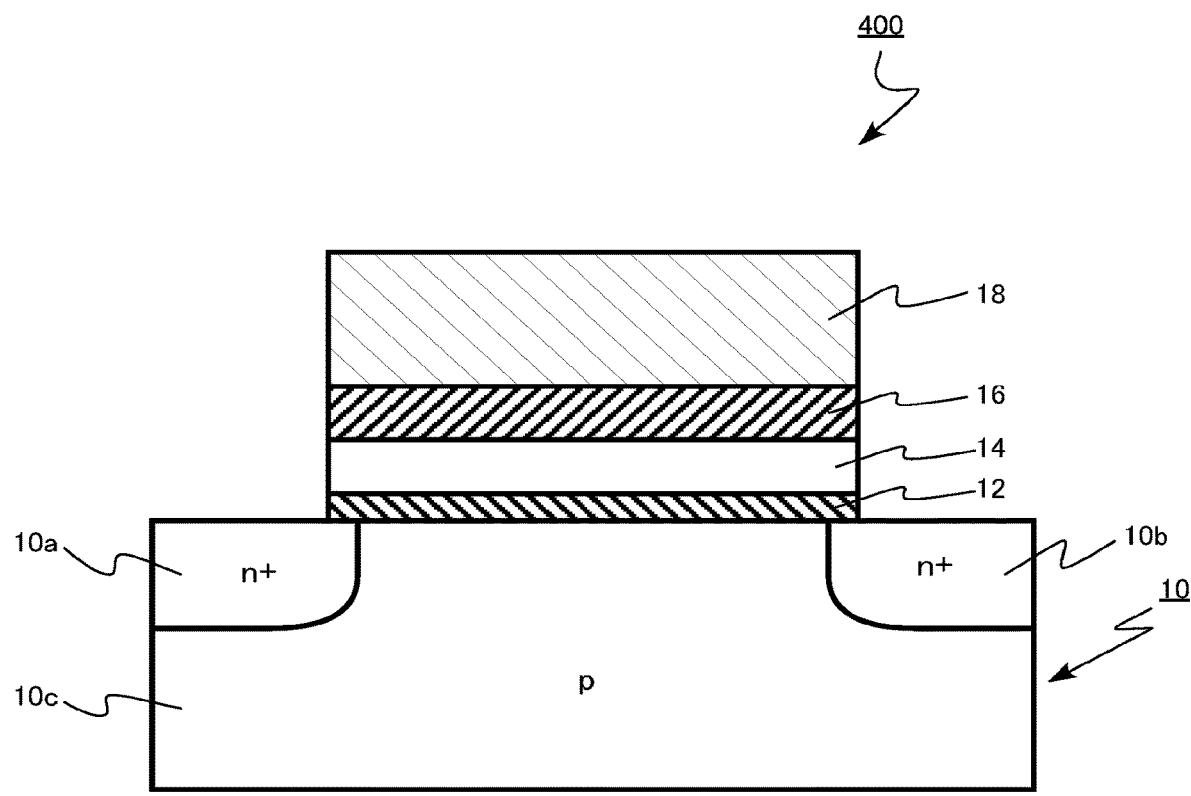
FIG. 9 is a schematic cross-sectional view of a semiconductor memory device of a fourth embodiment.

FIG. 9 is a schematic cross-sectional view of the semiconductor memory device of the fourth embodiment. The semiconductor memory device of the fourth embodiment is a charge trap memory cell 400 that traps a charge in a charge storage layer.

The memory cell 400 of the fourth embodiment includes the semiconductor layer 10, the tunnel insulating layer 12, the charge storage layer 14, the block insulating layer 16, and the gate electrode layer 18. The tunnel insulating layer 12 is an example of a first insulating layer. The charge storage layer 14 is an example of an intermediate layer. The block insulating layer 16 is an example of a second insulating layer. The semiconductor layer 10 has a source region 10a, a drain region 10b, and a channel region 10c.

The charge storage layer 14 contains the first crystal of the space group Pbca (space group number 61), the space group $P4_2/nmc$ (space group number 137), or the space group R-3m (space group number 166), and contains hafnium (Hf), oxygen (O), and at least one impurity element selected from the group consisting of silicon (Si), germanium (Ge), aluminum (Al), strontium (Sr), niobium (Nb), tantalum (Ta), molybdenum (Mo), tungsten (W), yttrium (Y), lanthanoids, ruthenium (Ru), and barium (Ba).

The first crystal is hafnium oxide. Hafnium oxide of the space group Pbca (space group number 61) is an antiferroelectric substance. Hafnium oxide of the space group $P4_2/nmc$ (space group number 137) is an antiferroelectric substance. Hafnium oxide of the space group R-3m (space group number 166) is an antiferroelectric substance. The charge storage layer 14 is an antiferroelectric layer.

The charge storage layer 14 has hafnium oxide as a main component. Having the hafnium oxide as the main component means that the hafnium oxide occupies the highest proportion among components contained in the charge storage layer 14. The charge storage layer 14 is an antiferroelectric hafnium oxide layer.

An atomic ratio of hafnium (Hf) and oxygen (O) among elements contained in the charge storage layer 14 is, for example, 90% or more.

An atomic ratio of hafnium (Hf), zirconium (Zr), and oxygen (O) among the elements contained in the charge storage layer 14 is, for example, 90% or more.

When the impurity element contained in the charge storage layer 14 does not contain barium (Ba), an atomic ratio of the impurity element to the sum of hafnium (Hf) contained in the charge storage layer 14 and the impurity element is 6% or more and 15% or less. When the above range is satisfied, antiferroelectric hafnium oxide is formed in the charge storage layer 14.

When the impurity element contained in the charge storage layer 14 is barium (Ba), an atomic ratio of barium (Ba) to the sum of hafnium (Hf) and barium (Ba) contained in the charge storage layer 14 is 3% or more and 10% or less. When the above range is satisfied, antiferroelectric hafnium oxide is formed in the charge storage layer 14.

A thickness of the charge storage layer 14 is, for example, 2 nm or more and 10 nm or less.

Since the charge storage layer 14 contains the antiferroelectric hafnium oxide according to the memory cell 400 of the fourth embodiment, the charge storage density of the charge storage layer 14 can be improved.

As described above, the semiconductor memory device capable of improving the charge storage density of the charge storage layer can be realized according to the fourth embodiment.

Fifth Embodiment

A semiconductor memory device of a fifth embodiment includes: a semiconductor layer; a gate electrode; a first insulating layer provided between the semiconductor layer and the gate electrode; a second insulating layer provided between the first insulating layer and the gate electrode; and an intermediate layer provided between the first insulating layer and the second insulating layer, the intermediate layer containing a first crystal of a space group Pbca (space group number 61), a space group P4$_2$/nmc (space group number 137), or a space group R-3m (space group number 166), and the intermediate layer containing zirconium (Zr). The semiconductor memory device of the fifth embodiment is different from the semiconductor memory device of the first embodiment in terms that a material of an intermediate layer is different. Hereinafter, some of the content overlapping with that in the first embodiment will not be described.

Figure 10:
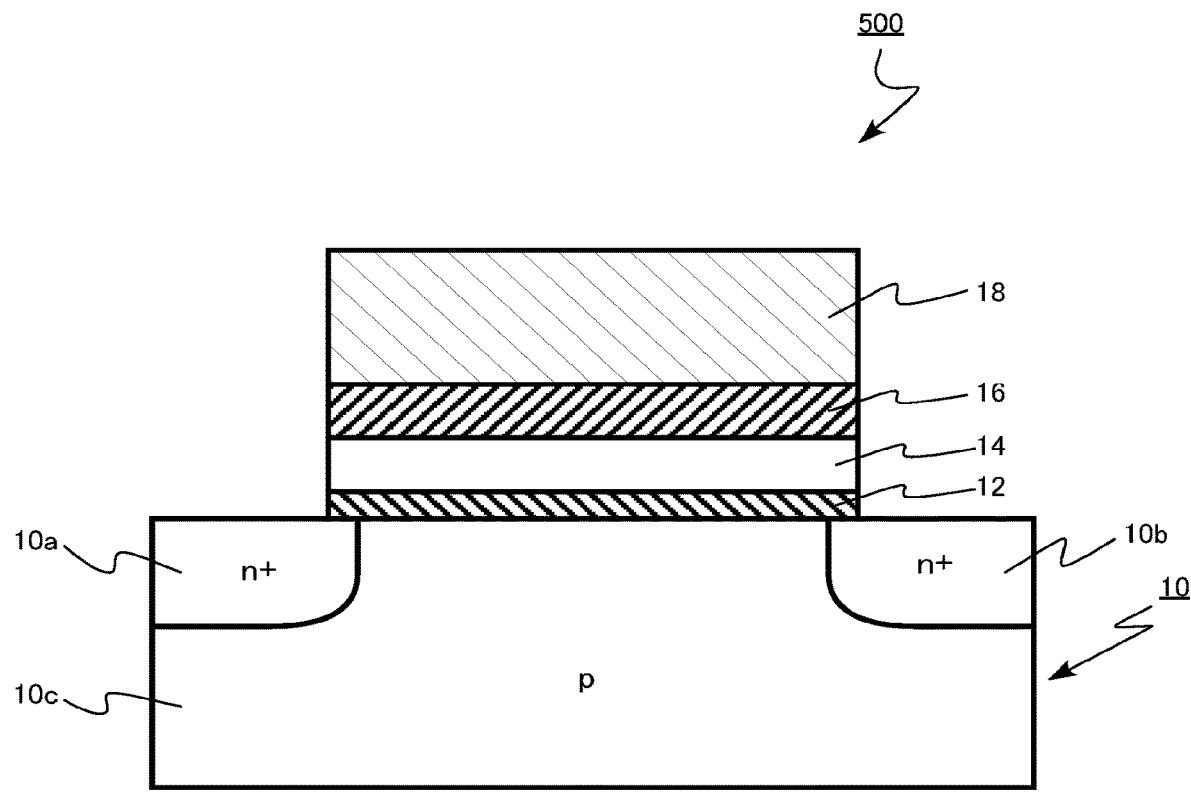
FIG. 10 is a schematic cross-sectional view of a semiconductor memory device of a fifth embodiment.

FIG. 10 is a schematic cross-sectional view of the semiconductor memory device of the fifth embodiment. The semiconductor memory device of the fifth embodiment is a charge trap memory cell 500 that traps a charge in a charge storage layer.

The memory cell 500 of the fifth embodiment includes the semiconductor layer 10, the tunnel insulating layer 12, the charge storage layer 14, the block insulating layer 16, and the gate electrode layer 18. The tunnel insulating layer 12 is an example of a first insulating layer. The charge storage layer 14 is an example of an intermediate layer. The block insulating layer 16 is an example of a second insulating layer. The semiconductor layer 10 has a source region 10a, a drain region 10b, and a channel region 10c.

The charge storage layer 14 contains the first crystal of the space group Pbca (space group number 61), the space group P4$_2$/nmc (space group number 137), or the space group R-3m (space group number 166), and contains zirconium (Zr).

The charge storage layer 14 contains, for example, hafnium (Hf), and an atomic ratio of zirconium (Zr) to the sum of hafnium (Hf) and zirconium (Zr) contained in the charge storage layer 14 is 70% or more.

The first crystal is zirconium oxide. The zirconium oxide of the space group Pbca (space group number 61) is an antiferroelectric substance. The zirconium oxide of the space group Pbca (space group number 61) is an antiferroelectric substance. The charge storage layer 14 is an antiferroelectric layer.

The charge storage layer 14 has zirconium oxide as a main component. Having the zirconium oxide as the main component means that the zirconium oxide occupies the highest proportion among components contained in the charge storage layer 14. The charge storage layer 14 is an antiferroelectric zirconium oxide layer.

An atomic ratio of zirconium (Zr) and oxygen (O) among elements contained in the charge storage layer 14 is, for example, 90% or more.

An atomic ratio of hafnium (Hf), zirconium (Zr), and oxygen (O) among the elements contained in the charge storage layer 14 is, for example, 90% or more.

The charge storage layer 14 contains, for example, hafnium (Hf), and an atomic ratio of zirconium (Zr) to the sum of hafnium (Hf) and zirconium (Zr) contained in the charge storage layer 14 is 70% or more. When the above range is satisfied, antiferroelectric zirconium oxide is formed in the charge storage layer 14.

A thickness of the charge storage layer 14 is, for example, 2 nm or more and 10 nm or less.

Since the charge storage layer 14 contains the antiferroelectric zirconium oxide according to the memory cell 500 of the fifth embodiment, the charge storage density of the charge storage layer 14 can be improved.

As described above, the semiconductor memory device capable of improving the charge storage density of the charge storage layer can be realized according to the fifth embodiment.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a semiconductor layer;
    a gate electrode layer;
    a first insulating layer provided between the semiconductor layer and the gate electrode layer;
    a second insulating layer provided between the first insulating layer and the gate electrode layer; and
    a charge storage layer provided between the first insulating layer and the second insulating layer, the charge storage layer containing a first crystal of a space group Pbca (space group number 61), a space group P4$_2$/nmc (space group number 137), or a space group R-3m (space group number 166), and the charge storage layer containing hafnium (Hf), oxygen (O), and nitrogen (N).

2. The semiconductor memory device according to claim 1, wherein an atomic ratio of nitrogen (N) to a sum of hafnium (Hf), oxygen (O) and nitrogen (N) contained in the charge storage layer is 1.5% or more and 3.0% or less.

3. The semiconductor memory device according to claim 1, wherein the charge storage layer contains a second crystal of a space group P2$_1$c (space group number 14).

4. The semiconductor memory device according to claim 1, wherein the charge storage layer includes an amorphous region.

5. The semiconductor memory device according to claim 1, wherein a thickness of the charge storage layer is 2 nm or more and 10 nm or less.

6. The semiconductor memory device according to claim 1, wherein the first crystal is hafnium oxide.

7. A semiconductor memory device comprising:
    a semiconductor layer;
    a gate electrode layer;
    a first insulating layer provided between the semiconductor layer and the gate electrode layer;
    a second insulating layer provided between the first insulating layer and the gate, electrode layer; and
    an intermediate layer provided between the first insulating layer and the second insulating layer, the intermediate layer containing a first crystal of a space group Pbca (space group number 61), a space group P4$_2$/nmc (space group number 137), or a space group R-3m (space group number 166), and the intermediate layer containing hafnium (Hf), oxygen (O), and nitrogen (N);
    a first silicon nitride layer provided between the first insulating layer and the intermediate layer; and
    a second silicon nitride layer provided between the intermediate layer and the second insulating layer.

8. The semiconductor memory device according to claim 7, wherein a thickness of the first silicon nitride layer is thinner than a thickness of the intermediate layer, and a thickness of the second silicon nitride layer is thinner than the thickness of the intermediate layer.

9. A semiconductor memory device comprising:
a plurality of gate electrode layers spaced apart from each other and arranged in a first direction;
a semiconductor layer extending in the first direction;
a first insulating layer provided between the semiconductor layer and at least one gate electrode layer of the gate electrode layers;
a second insulating layer provided between the first insulating layer and the at least one gate electrode layer; and
a charge storage layer provided between the first insulating layer and the second insulating layer, the charge storage layer containing a first crystal of a space group Pbca (space group number 61), a space group P4$_2$/nmc (space group number 137), or a space group R-3m (space group number 166), and the charge storage layer containing hafnium (Hf), oxygen (O), and nitrogen (N).

10. The semiconductor memory device according to claim 9, wherein an atomic ratio of nitrogen (N) to a sum of hafnium (Hf), oxygen (O) and nitrogen (N) contained in the charge storage layer is 1.5% or more and 3.0% or less.

11. The semiconductor memory device according to claim 9, wherein the charge storage layer contains a second crystal of a space group P2$_1$c (space group number 14).

12. The semiconductor memory device according to claim 9, wherein the charge storage layer includes an amorphous region.

13. The semiconductor memory device according to claim 9, wherein a thickness of the charge storage layer is 2 nm or more and 10 nm or less.

14. The semiconductor memory device according to claim 9, wherein the first crystal is hafnium oxide.

15. A semiconductor memory device comprising:
a plurality of gate electrode layers spaced apart from each other and arranged in a first direction;
a semiconductor layer extending in the first direction;
a first insulating layer provided between the semiconductor layer and at least one gate electrode layer of the gate electrode layers;
a second insulating layer provided between the first insulating layer and the at least one gate electrode layer; and
an intermediate layer provided between first insulating layer and the second insulating layer, the intermediate layer containing a first crystal of a space group Pbca (space group number 61), a space group P4$_2$/nmc (space group number 137), or a space group R-3m (space group number 166), and the intermediate layer containing hafnium (Hf), oxygen (O), and nitrogen (N);
a first silicon nitride layer provided between the first insulating layer and the intermediate layer; and
a second silicon nitride layer provided between the intermediate layer and the second insulating layer.

16. A semiconductor memory device comprising:
a semiconductor layer;
a gate electrode;
a first insulating layer provided between the semiconductor layer and the gate electrode;
a second insulating layer provided between the first insulating layer and the gate electrode; and
an intermediate layer provided between the first insulating layer and the second insulating layer, the intermediate layer containing a first crystal of a space group Pbca (space group number 61), a space group P4$_2$/nmc (space group number 137), or a space group R-3m space group number 166), and the intermediate layer containing hafnium (Hf), oxygen (O), and at least one element selected from a group consisting of silicon (Si), germanium (Ge), aluminum (Al), strontium (Sr), niobium (Nb), tantalum (Ta), molybdenum (Mo), tungsten (W), Yttrium (Y), lanthanoid, and ruthenium (Ru),
wherein an atomic ratio of the at least one element to a sum of hafnium (Hf) and the at least one element contained in the intermediate layer is 6% or more and 15% or less.

17. A semiconductor memory device comprising:
a semiconductor layer;
a gate electrode;
a first insulating layer provided between the semiconductor layer and the grate electrode;
a second insulating layer provided between the first insulating layer and the gate electrode; and
an intermediate layer provided between the first insulating layer and the second insulating layer, the intermediate layer containing a first crystal of a space group Pbca (space group number 61), a space group P4$_2$/nmc (space group number 137), or a space group R-3m (space group number 166), and the intermediate layer containing hafnium (Hf), oxygen and barium (Ba),
wherein an atomic ratio of barium (Ba) to a sum of hafnium (Hf) and barium (Ba) contained in the intermediate layer is 3% or more and 10% or less.

18. A semiconductor memory device comprising:
a semiconductor layer;
a gate electrode;
a first insulating layer provided between the semiconductor layer and the gate electrode;
a second insulating layer provided between the first insulating layer and the Bate electrode; and
an intermediate layer provided between the first insulating layer and the second insulating layer, the intermediate layer containing a first crystal of a space group Pbca (space group number 61), a space group P4$_2$/nmc (space group number 137), or a space group R-3m (space group number 166), and the intermediate layer containing zirconium (Zr) and hafnium (Hf),
wherein an atomic ratio of zirconium (Zr) to a sum of hafnium (Hf) and zirconium (Zr) contained in the intermediate layer is 70% or more.

19. The semiconductor memory device according to claim 7, wherein an atomic ratio of nitrogen (N) to a sum of hafnium (Hf), oxygen (O) and nitrogen (N) contained in the intermediate layer is 1.5% or more and 3.0% or less.

20. The semiconductor memory device according to claim 7, wherein the intermediate layer contains a second crystal of a space group P2$_1$c (space group number 14).

21. The semiconductor memory device according to claim 7, wherein the intermediate layer includes an amorphous region.

22. The semiconductor memory device according to claim 7, wherein a thickness of the intermediate layer is 2 nm or more and 10 nm or less.

23. The semiconductor memory device according to claim 7, wherein the first crystal is hafnium oxide.

24. The semiconductor memory device according to claim 15, wherein an atomic ratio of nitrogen (N) to a sum of hafnium (Hf), oxygen (O) and nitrogen (N) contained in the intermediate layer is 1.5% or more and 3.0% or less.

25. The semiconductor memory device according to claim 15, wherein the intermediate layer contains a second crystal of a space group $P2_1c$ (space group number 14).

26. The semiconductor memory device according to claim 15, wherein the intermediate layer includes an amorphous region.

27. The semiconductor memory device according to claim 15, wherein a thickness of the intermediate layer is 2 nm or more and 10 nm or less.

28. The semiconductor memory device according to claim 15, wherein the first crystal is hafnium oxide.

* * * * *